US009628032B1

(12) United States Patent
Marbell et al.

(10) Patent No.: US 9,628,032 B1
(45) Date of Patent: Apr. 18, 2017

(54) RF DEVICE PACKAGE WITH INTEGRATED HYBRID COUPLER

(71) Applicant: Infineon Technologies AG, Neubiberg (DE)

(72) Inventors: Marvin Marbell, Morgan Hill, CA (US); Bill Agar, Jr., Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/966,474

(22) Filed: Dec. 11, 2015

(51) Int. Cl.
*H03F 3/60* (2006.01)
*H03F 1/56* (2006.01)
*H03F 1/02* (2006.01)
*H03F 3/195* (2006.01)
*H03F 3/213* (2006.01)

(52) U.S. Cl.
CPC .......... *H03F 1/565* (2013.01); *H03F 1/0288* (2013.01); *H03F 3/195* (2013.01); *H03F 3/213* (2013.01); *H03F 2200/387* (2013.01); *H03F 2200/451* (2013.01)

(58) Field of Classification Search
CPC ........................................................ H03F 3/16
USPC ........................................ 330/300, 302, 306
See application file for complete search history.

(56) References Cited

U.S. PATENT DOCUMENTS

| 6,026,286 A * | 2/2000 | Long | H03D 7/1433 |
| | | | 455/319 |
| 2005/0110431 A1* | 5/2005 | Ben-Yaakov | H02M 3/3372 |
| | | | 315/291 |
| 2009/0261901 A1* | 10/2009 | Meharry | H03F 3/602 |
| | | | 330/124 R |
| 2011/0210786 A1* | 9/2011 | Blednov | H03F 1/0288 |
| | | | 330/124 R |
| 2013/0130750 A1* | 5/2013 | Chang | H03F 3/19 |
| | | | 455/571 |
| 2015/0123208 A1 | 5/2015 | Marbell et al. | |
| 2016/0099681 A1* | 4/2016 | Zong | H03B 5/1215 |
| | | | 331/117 FE |

OTHER PUBLICATIONS

Marbell, M. et al., "Inductively Coupled Transformer with Tunable Impedance Match Network", U.S. Appl. No. 14/618,305, filed Feb. 10, 2015, Unpublished, pp. 1-33.

* cited by examiner

*Primary Examiner* — Patricia T Nguyen
(74) *Attorney, Agent, or Firm* — Murphy, Bilak & Homiller, PLLC (57) ABSTRACT

An RF device package includes an RF input terminal, first and second amplifier input nodes, and a hybrid coupler integrally formed as part of the RF device package and connected between the RF input terminal and the first and second amplifier input nodes. The hybrid coupler includes a first LC network directly electrically connected to the RF input terminal and physically disconnected from the first and second amplifier input nodes, a second LC network directly electrically connected to the first amplifier input node and physically disconnected from the RF input terminal and the second amplifier input node, and a third LC network directly electrically connected to the second amplifier input node and physically disconnected from the RF input terminal and the first amplifier input node. The second and third LC networks are each inductively coupled to the first LC network in a transformer configuration.

20 Claims, 8 Drawing Sheets

RF DEVICE PACKAGE WITH INTEGRATED HYBRID COUPLER

TECHNICAL FIELD

The instant application relates to RF signal transmission, and more particularly to couplers for feeding an RF signal into an amplifier circuit.

BACKGROUND

RF amplifier circuits are used in a wide variety of applications. High power transistors such as LDMOS (laterally diffused metal oxide semiconductor) transistors are commonly used to form RF amplifiers. These transistors are typically packaged in a universal device package that can be easily connected to an external component, such as a printed circuit board (PCB).

Doherty power amplifiers are becoming increasingly commonplace in RF applications due to their high efficiency over a wide bandwidth. A Doherty amplifier configuration includes a main amplifier and a peaking amplifier. The main amplifier operates at high efficiency and provides RF signal amplification during most operating ranges. When additional power is required, the peaking amplifier turns on. Packaged Doherty amplifier configurations typically include input and output match networks integrated within the device package to feed the RF signal into the main and peaking power transistors and to combine the RF power generated from the main and peaking power transistors. The input and output match networks are also typically tuned to a fixed impedance match value (e.g., 50 ohms).

In a Doherty amplifier, the input impedance of the peak amplifier (which is biased in class C) will change with RF power drive level. This change in impedance can detune the input matching of the main amplifier, leading to unfavorable am-am and am-pm performance, or even reliability and ruggedness problems.

One way to mitigate detuning of the input matching network is to externally connect (i.e., outside of the package) a hybrid coupler. The hybrid coupler isolates the RF signal between inputs of the main and peaking amplifiers. However, one drawback of this technique is that it requires the input of the main and peaking power transistors to first be matched to 50 ohms before connection to the hybrid coupler, and this limits the frequency bandwidth of the Doherty amplifier. Additionally, externally connectable hybrid couplers are only available with a fixed phase differential e.g., 90 degrees, 180 degrees etc. In many cases, it is desirable to adjust the overall phase differential to the optimum value (e.g., slightly more or less than 90 or 180 degrees). The only way that this can be done is to interpose phase delay lines (e.g., inductors, capacitors, PCB transmission lines, etc.) between the hybrid coupler and the packaged Doherty amplifier, which increases cost and complexity of the device. Use of external hybrid couplers therefore limits how small and cost effective the Doherty amplifier board can be made.

In another configuration, the external hybrid coupler is omitted and the inputs of the Doherty Amplifier are joined by an external 90 degree phase line. However, without the hybrid coupler, there is poor isolation between the main and peak amplifiers. This leads to performance and reliability issues. In addition, am-am and am-pm performance becomes very sensitive to manufacturing variations in the main and peak transistors, thus leading to poor yield.

SUMMARY

An RF device package is disclosed. According to an embodiment, the RF device package includes an RF input terminal and first and second amplifier input nodes. The RF device package further includes a hybrid coupler integrally formed as part of the RF device package. The hybrid coupler is connected between the RF input terminal and the first and second amplifier input nodes. The hybrid coupler includes a first LC network that is directly electrically connected to the RF input terminal and is physically disconnected from the first and second amplifier input nodes, a second LC network that is directly electrically connected to the first amplifier input node and is physically disconnected from the RF input terminal and the second amplifier input node, and a third LC network that is directly electrically connected to the second amplifier input node and is physically disconnected from the RF input terminal and the first amplifier input node. The second and third LC networks are each inductively coupled to the first LC network in a transformer configuration.

A packaged RF amplifier circuit is disclosed. According to an embodiment, the packaged RF amplifier circuit includes an RF input terminal, an RF output terminal and first and second amplifiers. The first and second amplifiers each have an input coupled to the RF input terminal and an output coupled to the RF output terminal. The amplifier circuit further includes a hybrid coupler integrally formed as part of the packaged RF amplifier circuit. The hybrid coupler is connected between the RF input terminal and the inputs of the first and second amplifiers. The hybrid coupler includes a first LC network that is directly electrically connected to the RF input terminal and is physically disconnected from the inputs of the first and second amplifiers, a second LC network that is directly electrically connected to the input of the first amplifier and is physically disconnected from the RF input terminal and the input of the second amplifier, and a third LC network that is directly electrically connected to the input of the second amplifier and is physically disconnected from the RF input terminal and the input of the first amplifier. The second and third LC networks are each inductively coupled to the first LC network in a transformer configuration.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3, which includes FIGS. 3A-3C, illustrates a configuration of the hybrid coupler of FIG. 2 that is formed by an arrangement of wire-bonds, chip capacitors and resistors, according to an embodiment. FIG. 3A illustrates a diagonal view of the hybrid coupler, FIG. 3B illustrates a plan view of the hybrid coupler, and FIG. 3C illustrates a close up view of a branch isolation resistor.

FIG. 5, which includes FIGS. 5A-5B, illustrates a configuration of the hybrid coupler of FIG. 4 that is formed by an arrangement of wire-bonds, chip capacitors and resistors, according to an embodiment. FIG. 5A illustrates a diagonal view of the hybrid coupler, and FIG. 5B illustrates a plan view of the hybrid coupler.

FIG. 7, which includes FIGS. 7A-7B, illustrates a configuration of the hybrid coupler of FIG. 6 that is formed by an arrangement of wire-bonds, chip capacitors and resistors, according to an embodiment. FIG. 7A illustrates a diagonal view of the hybrid coupler, and FIG. 7B illustrates a plan view of the hybrid coupler.

FIG. 8, which includes FIGS. 8A-8B, illustrates a packaged RF amplifier circuit that includes a hybrid coupler integrally formed as part of the packaged RF amplifier circuit, according to an embodiment. FIG. 8A illustrates a diagonal view of the packaged RF amplifier circuit, and FIG. 8B illustrates a plan view of the packaged RF amplifier circuit.

DETAILED DESCRIPTION

Embodiments described herein include an RF device package with a hybrid coupler integrally formed as part of the package structure. Because the hybrid coupler is provided within the package structure, there is no need to externally connect a hybrid coupler at the board level. If, for example, the RF device package is configured as a molded cavity package, the hybrid coupler is located within the package cavity such that no external hybrid coupler is necessary.

The RF device package can be used in any RF application in which isolation as between two inputs is necessary. For example, the RF device package can be used with a Doherty amplifier circuit, wherein the hybrid coupler is connected such that it will feed the inputs of the main and peaking amplifiers. This construction provides a high degree of isolation (e.g., 15 dB or more) between the main and peaking amplifiers of the Doherty amplifier.

According to one embodiment, the hybrid coupler is formed from an arrangement of wire-bonds, chip capacitors and resistors that are mounted to a substrate of the RF device package. These elements can be located between the RF input lead and the mounting locations of the power transistors. Spans of bonding wires are interdigitated with one another to form cross-coupled inductors. The cross-coupled inductors propagate RF signals to separate branches of the hybrid coupler but block reflected low frequency and DC signals. In this way, the input terminals of the main and peaking amplifier are isolated from one another (both physically and electrically), yet both are coupled to the RF input node.

The incorporation of the hybrid coupler within the device package eliminates the need for an external hybrid coupler and also eliminates the need for external phase delay lines. The user only needs to match the input and output impedances of the Doherty amplifier to a fixed value (e.g., 50 ohms). Accordingly, a much smaller and cost effective Doherty amplifier can be assembled using the embodiments described herein to meet the ever increasing demand from customers for smaller and less-expensive designs. Compared to other integrated Doherty amplifier designs, the high degree of isolation between main and peak transistors provided by the hybrid coupler will produces better am-am and am-pm curves, better ruggedness and reliability, and less sensitivity to manufacturing variations in transistor performance. Further advantages will be appreciated by those of ordinary skill in light of the following description of the figures.

Figure 1:
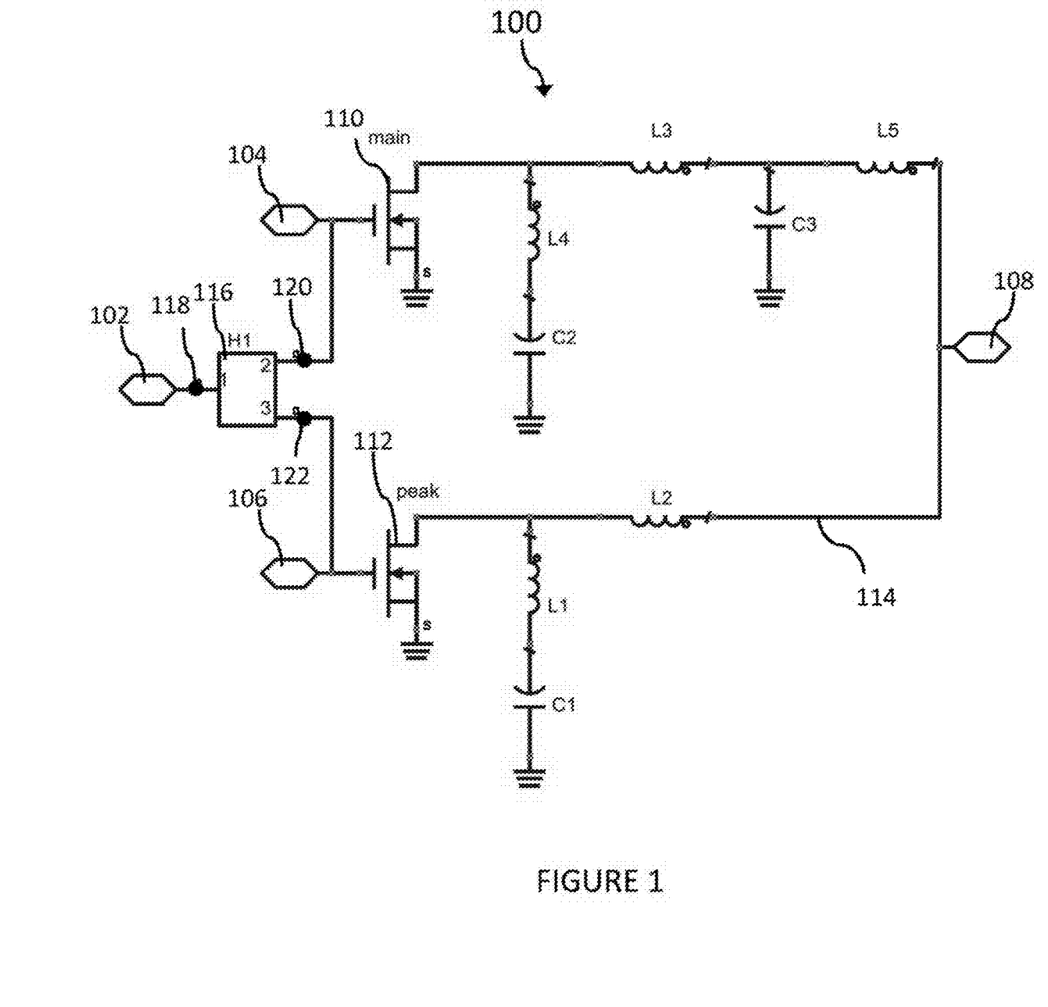
FIG. 1 illustrates a schematic of an RF amplifier circuit that includes a hybrid coupler feeding an RF signal to the inputs of two transistors, according to an embodiment.

Referring to FIG. 1, a top-level circuit topology an RF amplifier circuit 100 is depicted. Thus RF amplifier circuit 100 can be incorporated into a device package. That is, the terminals of the RF amplifier circuit 100 can be the connection points (e.g., leads) of a device package wherein these terminals are externally connectable to an external device (e.g., PCB). The RF amplifier circuit 100 includes an RF input terminal 102, first and second DC feed terminals 104, 106, and an RF output terminal 108. The RF amplifier circuit 100 amplifies an RF signal that is applied to the RF input terminal 102 and the amplified version of the RF signal appears at the RF output terminal 108.

The RF amplifier circuit 100 can include any of a variety of active device configurations. According to an embodiment, the RF amplifier circuit 100 is configured as a Doherty amplifier with a first power transistor 110 that forms the main amplifier and a second power transistor 112 that forms the peaking amplifier. The first and second power transistors 110, 112 may be provided from any of a variety of switching devices, e.g., MOSFETs, LDMOSFETs, BJTs, etc. The first and second DC feed terminals 104, 106 allow for a DC bias to be directly applied to the input nodes (e.g., the gate nodes) of the main and peaking amplifiers, respectively. The outputs of the main and peaking amplifiers feed into the RF output terminal 108. The RF amplifier circuit 100 further includes an output matching network 114 to combine the power generated from the main and peaking amplifiers and match the output impedance of the RF amplifier circuit 100 to a fixed intermediate value (e.g., 5 ohms). A PCB matching network external to the RF amplifier circuit 100 can ultimately be used to match the intermediate output impedance (e.g. 5 ohms) to a final fixed value (e.g., 50 ohms).

The RF amplifier circuit 100 further includes a hybrid coupler 116 connected between the RF input terminal 102 and the inputs of the main and peaking amplifiers. The hybrid coupler 116 is a passive RF device having a first input port 118 and first and second output ports 120, 122. The hybrid coupler 116 provides electrical isolation between the first and second output ports 120, 122. That is, voltages impressed upon one of the first and second output ports 120, 122 do not appear at the opposite one of the first and second output ports 120, 122. The hybrid coupler 116 divides the power of an RF signal applied to the first input port 118 between the first and second output ports 120, 122. In the embodiment of FIG. 1, the first and second output ports 120, 122 are connected to the input terminals (i.e., gates) of the first and second power transistors 110, 112 such that the hybrid coupler 116 will divide the input power of an RF signal applied to the RF input terminal 102 between these two input terminals (i.e., gates) of the first and second power transistors 110, 112. The power split of the hybrid coupler 116 may be equal or unequal. In one embodiment, the hybrid coupler 116 is a so-called 3 dB coupler that divides RF power appearing at the RF input terminal 102 equally between the first and second output ports 120, 122. That is, each of the inputs of the first and second power transistors 110, 112 receives 50 percent of the power of the RF signal. Alternatively, the hybrid coupler 116 may be configured to divide RF power asymmetrically. Furthermore, the hybrid coupler 116 may also be configured to incorporate a phase shift in the RF signal as between the first and second output ports 120, 122. The phase shift can be any value including, but not limited to, 90 degrees or 180 degrees.

Figure 2:
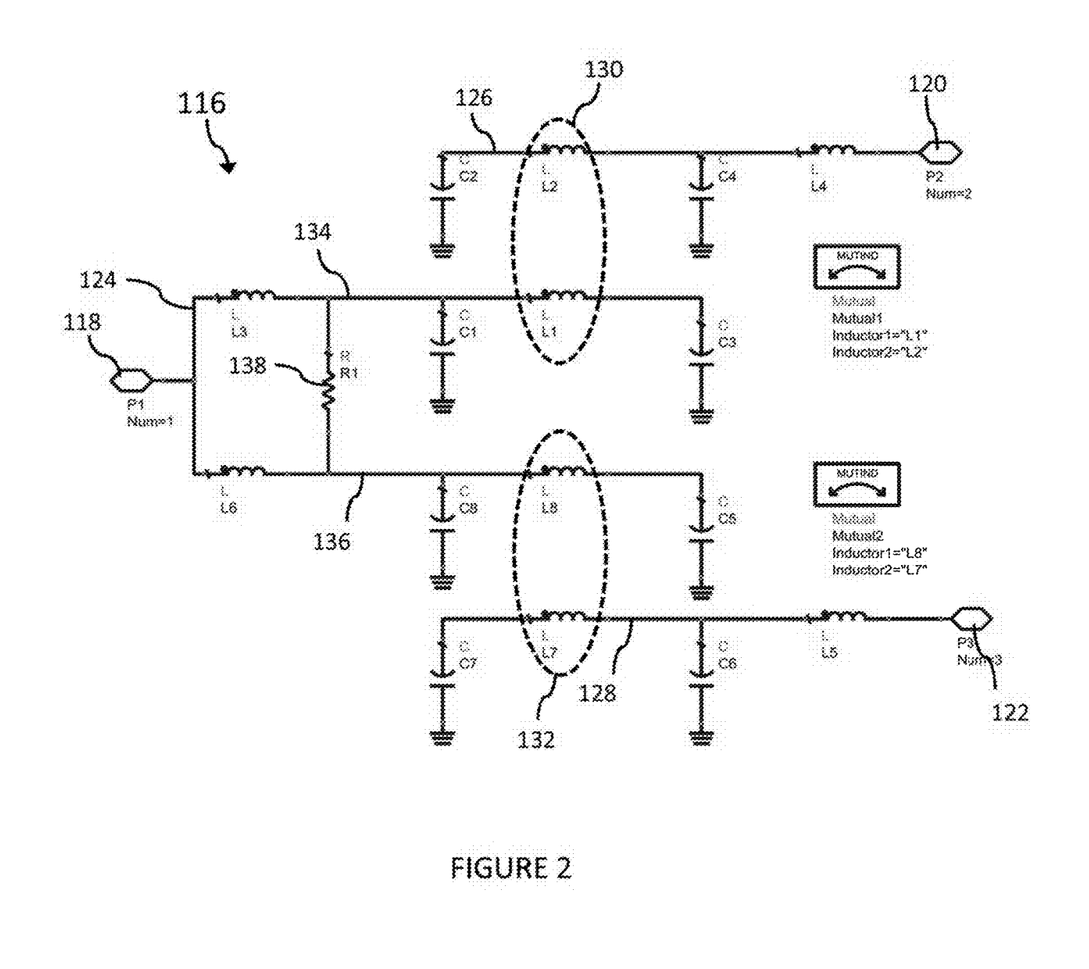
FIG. 2 illustrates a schematic of a hybrid coupler, according to an embodiment.

Referring to FIG. 2, a circuit topology of the hybrid coupler 116 is depicted, according to an embodiment. The hybrid coupler 116 includes a first input port 118 and first and second output ports 120, 122. The first input port 118 may be directly electrically connected to, e.g., the RF input terminal 102 (as shown in FIG. 1) within a device package. The first and second output ports 120, 122 may be directly connected to the input terminals of the main amplifier and the peaking amplifier (as shown in FIG. 1) within a device package.

The hybrid coupler 116 includes a first LC network 124 that is directly electrically connected to the first input port 118, a second LC network 126 that is directly electrically connected to the first output port 120, and a third LC network 128 that is directly electrically connected to the second output port 122. Each of the first, second and third LC networks 124, 126 and 128 are physically disconnected from one another. That is, the conductors of the first LC network 124 are completely physically separated from the conductors of the second and third LC networks 126, 128, the conductors of the second LC network 126 are completely physically separated from the conductors of the first and third LC networks, 124, 128 and the conductors of the third LC network 128 are completely physically separated from the conductors of the first and second LC networks, 124 and 126.

Although the first LC network 124 is physically disconnected from the second and third LC networks 126, 128, the first LC network 124 is electrically coupled to the second and third LC networks 126, 128 by inductive coupling. More particularly, a first transformer 130 couples the first LC network 124 to the second LC network 126, and a second transformer 132 couples the first LC network 124 to the third LC network 128. In this way, an AC signal applied to the first input port 118 will propagate to the first and second output ports 120, 122. Advantageously however, DC voltages and certain low frequency signals are blocked by the first and second transformers 130, 132. Thus, in the configuration of FIG. 1, the main and peaking amplifiers can each be biased independently by a DC signal, which is essential for the proper operation of a Doherty amplifier.

According to an embodiment, the first LC network 124 includes first and second branches 134, 136 that are electrically parallel to one another. The first transformer 130 is provided on the first branch 134 and the second transformer 132 is provided on the second branch 136. The first LC network 124 further includes a first resistor 138 connected in series between the first and second branches 134, 136.

Advantageously, the hybrid coupler 116 provides a high degree of isolation (e.g., 15 dB or more) between the first and second output ports 120, 122. This high degree of isolation may be particularly advantageous, for instance, in the Doherty amplifier configuration of FIG. 1. Due to this isolation, unwanted reflections in the third LC network 128 are substantially prevented from reaching the second LC network 126. Likewise, unwanted reflections in the second LC network 126 are substantially prevented from reaching the third LC network 128. In either case, both the first and second transformers 130, 132 isolate the reflections from reaching the one of the first and second output ports 120, 122 that is opposite from the reflection. The inclusion of the first resistor 138 between the first and second branches 134, 136 of the first LC network 124 advantageously increases the isolation between the first and second output ports 120, 122, as any reflections that appear on the first branch 134 will be attenuated through the first resistor 138 before reaching the opposite second branch 136, and vice-versa. That is, the first resistor 138 introduces an additional degree of attenuation for signal reflections between the first and second output ports 120, 122.

Figure 3:
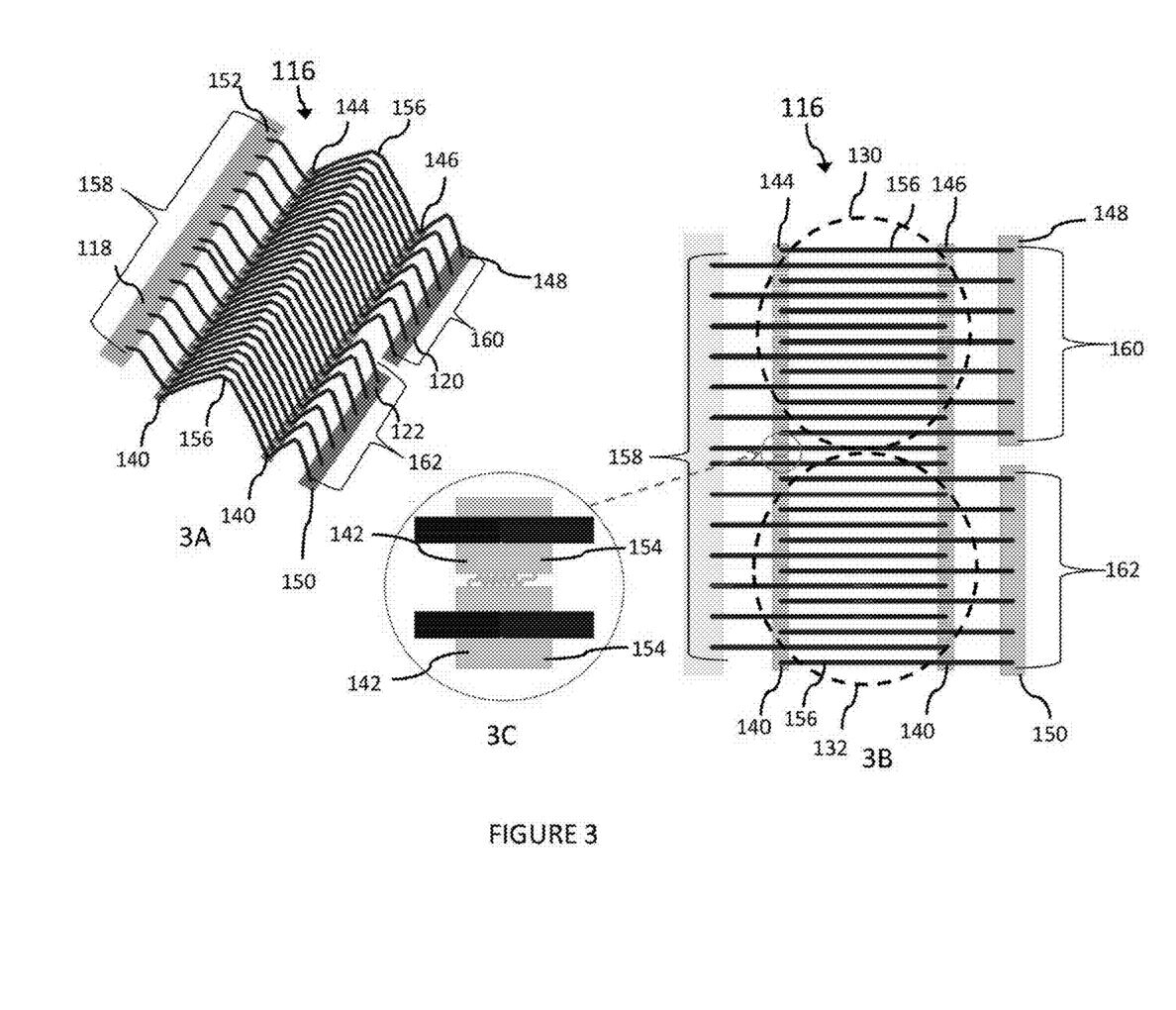

Referring to FIG. 3, an exemplary hybrid coupler 116 circuit that is formed by an arrangement of wire-bonds, chip capacitors and resistors is shown. This arrangement can be used to provide the circuit topology shown in FIG. 2.

Some or all of the capacitors of the hybrid coupler 116 circuit of FIG. 3 are formed from segmented capacitor arrays 140. Each segmented capacitor array 140 includes a plurality of discrete capacitors 142 arranged next to one another in a lengthwise string. In this lengthwise string, each capacitor 142 is disconnected from the immediately adjacent one. Alternating discrete capacitors may be joined together with a high conducting material to form interdigitated capacitor groups. For instance, referring back to FIG. 2, the hybrid coupler 116 circuit includes a set of four capacitors C1, C2, C7 and C8. This set is formed by one of the segmented capacitor arrays 140 by connecting four distinct groups of the capacitors 142 by conductive lines (not shown) that are beneath the segmented capacitor arrays 140.

According to an embodiment, the hybrid coupler 116 circuit includes a first and second segmented capacitor array 144, 146, and a first and second chip capacitor 148, 150. The first capacitor array 144 is immediately adjacent to a conductive pad 152 that forms the first input port 118 of the hybrid coupler 116. The second capacitor array 146 is the same length as the first capacitor array 144 and is adjacent to the first capacitor array 144. The first and second chip capacitors 148, 150 do not include multiple discrete capacitors and instead for a single capacitor. The first and second chip capacitors 148, 150 are adjacent to the second capacitor array 146, and are shorter than the first and second capacitor arrays 144, 146. This configuration provides a space-efficient layout, but it represents just one example. Any number of the segmented capacitor arrays or chip capacitors may be used to provide the hybrid coupler 116. In addition, any number of the discrete capacitors 142 together may be provided in each segmented capacitor arrays 140.

First (upper) terminals 154 of each of the capacitors 142 in the capacitor arrays 140 are accessible at an upper side of the segmented capacitor arrays 140. Second (lower) terminals (not shown) of each of the capacitors 142 are electrically accessible at opposite facing sides of the segmented capacitor arrays 140. In this way, the discrete capacitors 142 in each segmented capacitor array 140 can be directly electrically connected to a chip mounting surface that forms a common terminal (e.g., GND) by placing the segmented capacitor array 140 directly on an the substrate.

The segmented capacitor arrays 140 and the first and second chip capacitors 148, 150 may be formed from semiconductor devices. For example, these capacitors may be formed from technologies such as Silicon (Si), Silicon German (SiGe), Gallium Nitride (GaN), etc. Further, the segmented capacitor arrays 140 may be formed using any other material or technology that provides a lengthwise string of unit-cell capacitors. Further, the first and second chip capacitors 148, 150 can be provided from or considered as the input capacitance (e.g., gate capacitance) of a semiconductor device, such as a MOSFET.

Some or all of the inductors of the hybrid coupler 116 circuit may be formed from inductive bond wires 156 that are connected between the upper terminals 154 of each of the capacitors 142 in the segmented capacitor arrays 140 and the first and second chip capacitors 148, 150. The bond wires 156 can be formed from any electrical conductor, such as copper, aluminum, etc., and suitable alloys thereof. As those of ordinary skill will appreciate, there is a certain inductance associated with any wire connection. Thus, each span of bond wires 156 that extends between separate terminals (e.g., upper terminals 154 of two segmented capacitor arrays 140) provides a defined inductance. This inductance value can be determined and adjusted appropriately by tailoring the physical parameters of the spans of the bond wires 156. Exemplary physical parameters that can be tailored to achieve a desired inductance include height of the bond wires 156, separation distance between the bond wires 156, length of the spans of the bond wires 156, and material composition of the bond wires 156, to name a few.

According to an embodiment, the hybrid coupler 116 includes first, second and third sets 158, 160, 162 of bond wires 156 that each have a unique connectivity within the hybrid coupler 116. More particularly, a first set 158 of the inductive bond wires 156 is directly electrically connected to the first input port 118 and to the first and second segmented capacitor arrays 144, 146. The first set 158 of the inductive bond wires 156 is physically disconnected from the from the first and second chip capacitors 48, 150. A second set 160 of the inductive bond wires 156 is directly electrically connected to the first and second segmented capacitor arrays 144, 146 and the first chip capacitor 148. The second set 160 of the inductive bond wires 156 is physically disconnected from the second chip capacitor 150 and the first input port 118. A third set 162 of bond wires 156 is directly electrically connected to the first and second segmented capacitor arrays 144, 146 and the second chip capacitor 150. The third set 162 of bond wires 156 is physically disconnected from the first chip capacitor 148 and the first input port 118.

The first and second transformers 130, 132 of the hybrid coupler 116 are formed by interdigitated spans of the bond wires 156. As used herein, interdigitated refers to a configuration whereby differently connected bond wires 156 are arranged next to one another in alternating fashion. For example, in an interdigitated configuration, a bond wire 156 from the first set 158 is arranged immediately next to a bond wire 156 from the second set 160, which in turn is arranged immediately next to a bond wire 156 from the first set 158, and so on. Due to the close proximity of the interdigitated bond wires 156, a mutual inductance arises such that a magnetic field generated by one induces a current in the other, and vice-versa. In this way, physically disconnected bond wires 156 are configured to propagate AC signals, but block DC and low frequency AC signals.

The first transformer 130 is formed by a span of the first set 158 of bond wires 156 that is interdigitated with a span of the second set 160. The second transformer is formed by a span of the first set 158 of bond wires 156 that is interdigitated with a span of the third set 162. The parameters of the first and second transformers 130, 132 (e.g., transformer ratio) can be adjusted by appropriately tailoring the configuration of the bond wires 156, e.g., height, number of spans, etc. In the example of FIG. 3, the sets of bond wires 156 are interdigitated with one another in a 1:1 ratio, and thus the first and second transformers 130, 132 each have a 1:1 transformer ratio. However, other ratios are possible.

FIG. 3C depicts a close up view of a first resistor 138 that is connected between the first and second branches 134, 136 of the first LC network. The first resistor 138 is connected between two of the discrete capacitors 142 in the first segmented capacitor array 144. The first resistor 138 is formed by a resistive span of material connecting two of the discrete capacitors 142 together. One of these capacitors 142 is connected to the first branch 134 of the first LC network 124. The other capacitor 124 is connected to the second branch 136 of the first LC network 124.

According to an embodiment, the first resistor 138 is formed from an electrical conductor (e.g., copper, aluminum, etc.) connected between two of the capacitors 142 in the first segmented capacitor array 144. The electrical conductor may be may be intentionally formed in a non-linear geometry so as to provide additional electrical resistance. The geometry and material of the electrical conductor may be adjusted to achieve a desired resistance, e.g., a resistance that maximally attenuates RF signal reflections from the second and third LC networks 126, 128 at a desired operating point. According to an embodiment, the first resistor 138 has a resistance value between 1 and 10 ohms. The exact value of the resistance is tailored to optimize the isolation between the output ports 120,122 of the hybrid coupler 116 and depends on the operating design frequency and the size of the devices connected to the coupler outputs. According to another embodiment, the first resistor 138 is provided by a discrete component that is connected to two of the capacitors 142 in the first segmented capacitor array 144. According to yet another embodiment, the first resistor 138 is provided by one or more components integrated within the first segmented capacitor array 144.

Figure 4:
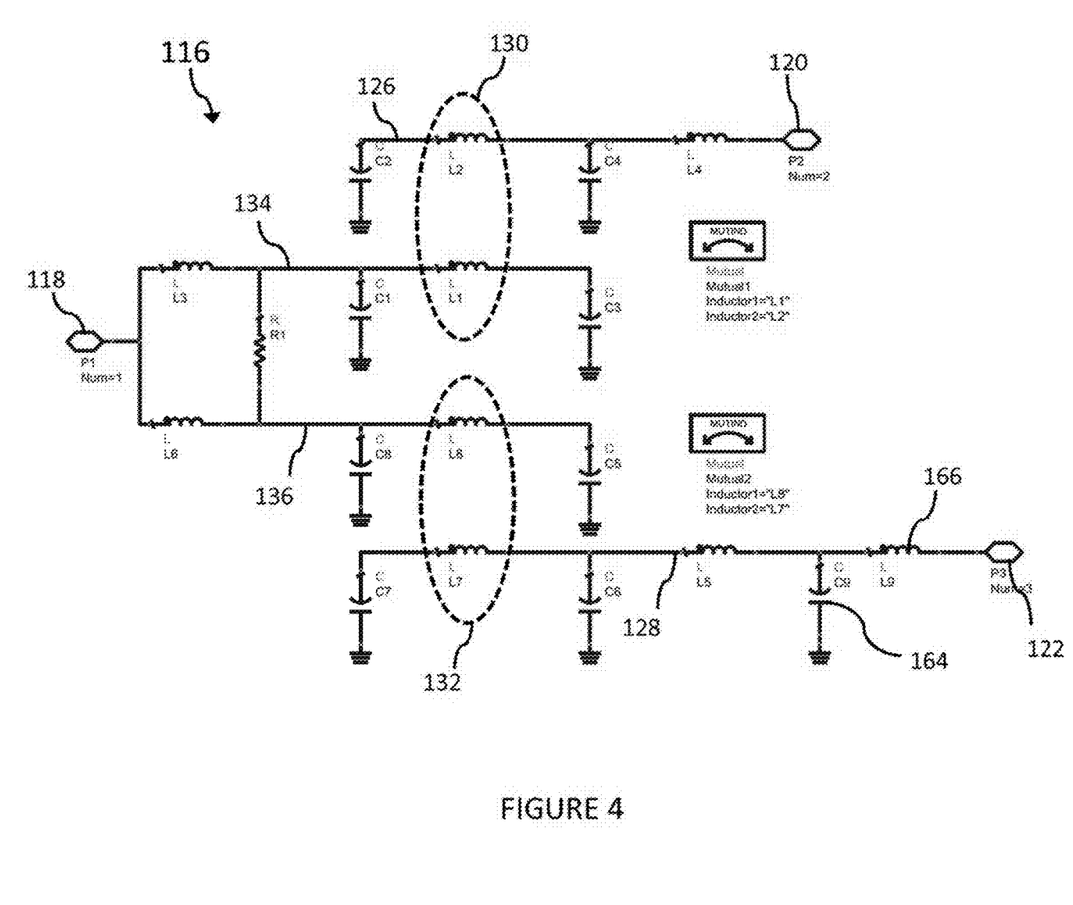
FIG. 4 illustrates a schematic of a hybrid coupler that is configured to provide a phase delay between the outputs, according to an embodiment.

Referring to FIG. 4, another circuit topology of the hybrid coupler 116 is depicted. The hybrid coupler 116 of FIG. 4 differs from the hybrid coupler 116 of FIG. 2 in that it additionally includes phase delay elements that are configured to incorporate a phase shift at the output ports 120, 122 of the hybrid coupler 116. That is, the RF signal at the first output port 120 is out of phase with the RF signal at the second output port 122 by a fixed amount (e.g., 90 degrees, 180 degrees, etc.). This is achieved by the incorporation of delay elements into the third LC network 128. The delay elements may be provided by any combination of reactive components (i.e., capacitors or inductors). For example, as shown in FIG. 4, the third LC network 128 includes an additional capacitor 164 and an additional inductor 166. The additional capacitor 164 and an additional inductor 166 do not have counterpart components in the second LC network 126. The additional inductor 166 and capacitor 164 therefore differentiate the impedance of the third LC network 128 from the second LC network 126. As a result, an RF signal that is applied to the first input port 118 and propagates across the first and second transformers 130, 132 (nominally) simultaneously will be shifted out of phase in the third LC network 128 due to the phase delay elements. The exact amount of the phase shift can be set by appropriately setting the parameters of the additional capacitor and inductor 164, 166. According to an embodiment, the impedance of the additional capacitor 164 and inductor 166 is such that the RF signal is ninety degrees out of phase at the output ports 120, 122. According to another embodiment, the additional capacitor and inductor 164, 166 are configured to shift the RF signal 180 degrees (i.e., completely out of phase) as between the output ports 120, 122.

Figure 5:
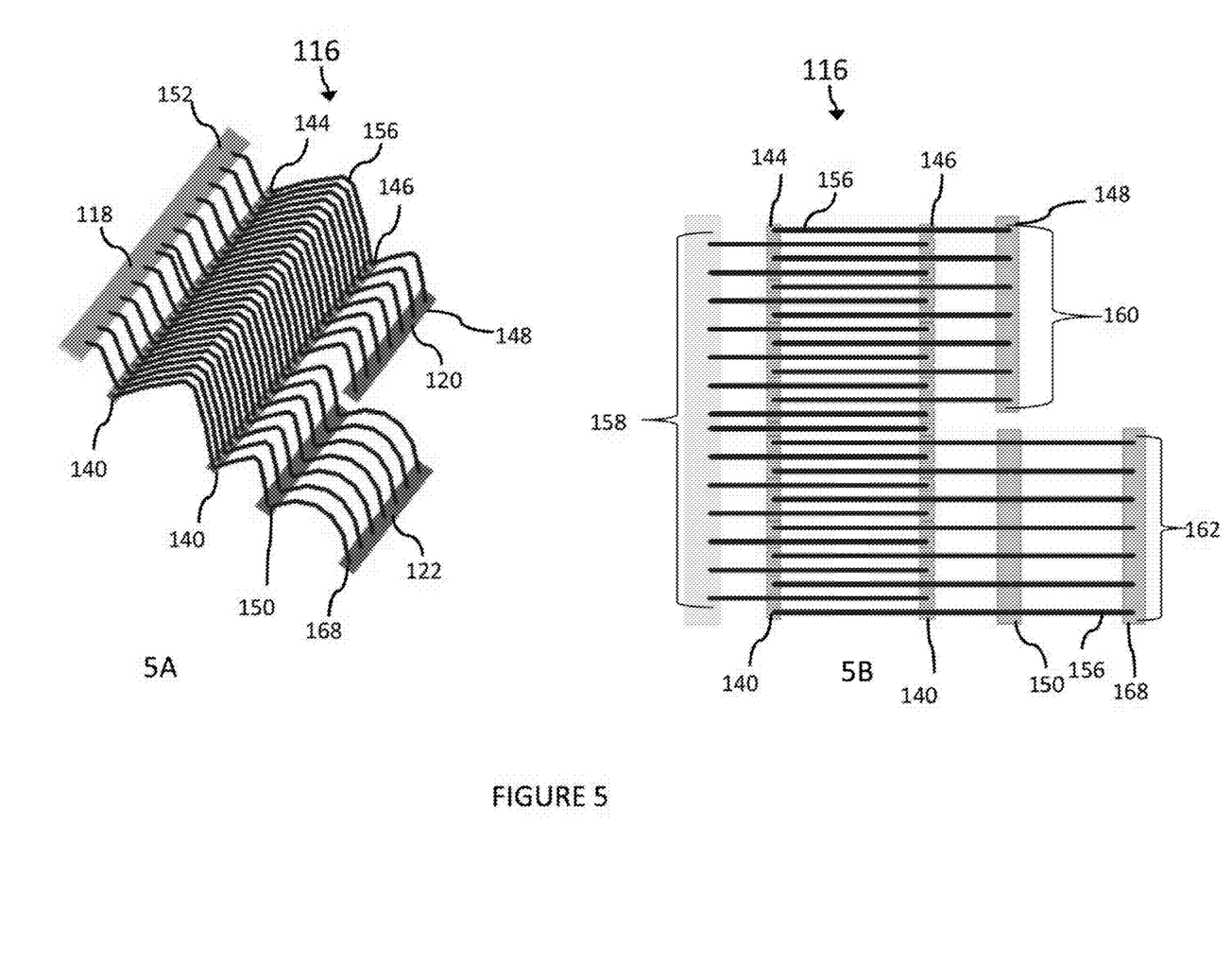

Referring to FIG. 5, an exemplary hybrid coupler 116 circuit that is formed by an arrangement of wire-bonds, chip capacitors and resistors is shown. This arrangement can be used to provide the circuit topology shown in FIG. 4, for example. The arrangement differs from the arrangement of FIG. 3 in that it additionally includes a third chip capacitor 168. The third chip capacitor 168 is used to provide the additional capacitor 164 of the third LC network 128 described above. The additional inductor 166 of the third LC network 128 described above is provided by spans of the third set 162 of bond wires 156 connecting the second chip capacitor 150 to the third chip capacitor 168. Advantageously, the parameters of these components can be easily adjusted to account for process variations or other deviations from nominal values. If, for instance, it is determined through testing that the phase shift of an RF signal between the output ports 120,122 of the hybrid coupler 116 is slightly different from a nominal value (e.g., ninety degrees), the properties of the additional capacitor and inductor 164, 166 can be easily adjusted by back end of the line processing to compensate for this deviation. For example, the height of the bond wires 156 and the amount of connections to the capacitors 142 in the third chip capacitor 168 can be altered to increase or decrease the impedance of the third LC network 128 and consequently achieve a nominal phase shift value.

Figure 6:
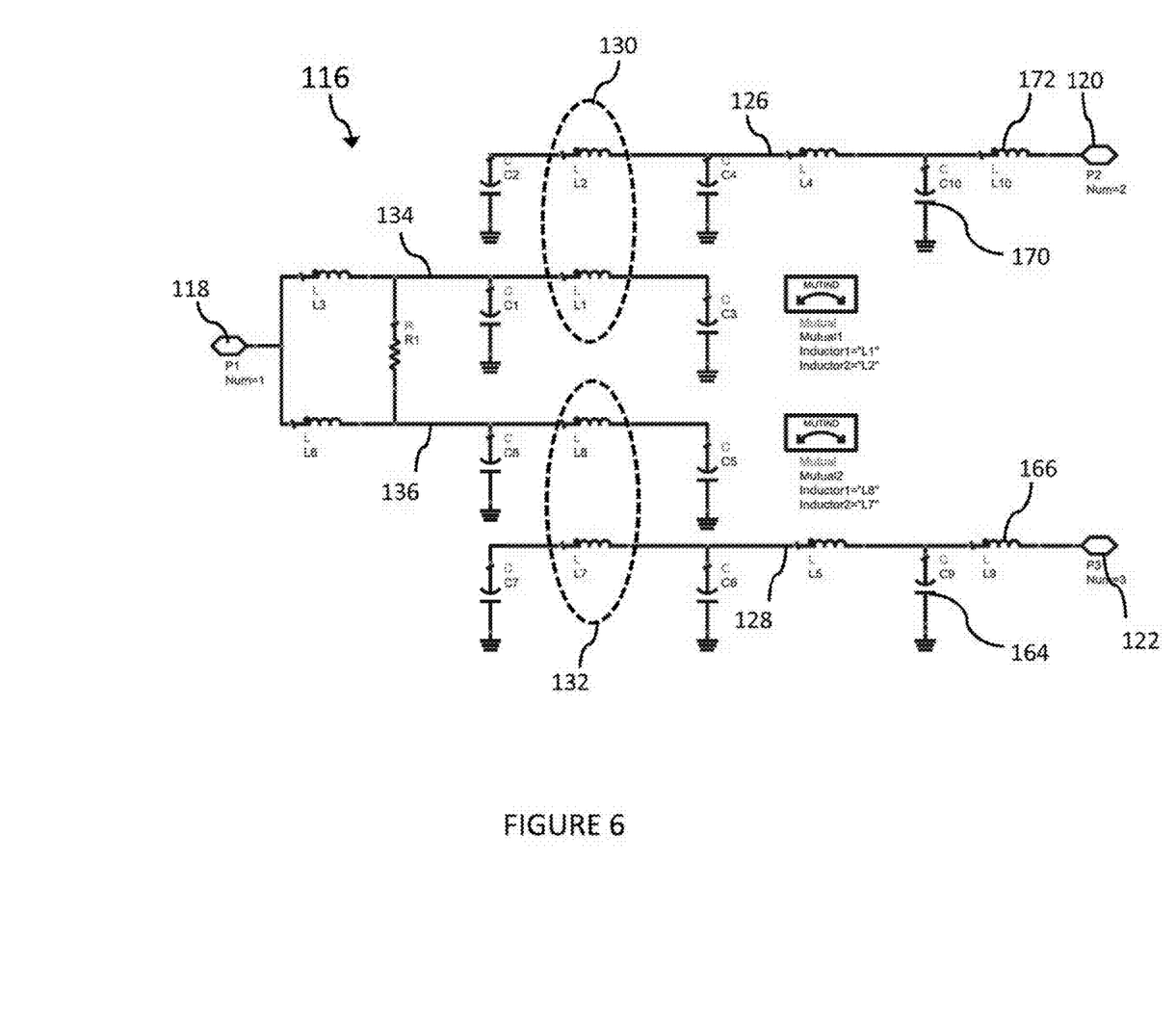
FIG. 6 illustrates a schematic of a hybrid coupler that is configured to provide a phase delay between the outputs, according to another embodiment.

Referring to FIG. 6, another circuit topology of the hybrid coupler 116 is depicted. The hybrid coupler 116 of FIG. 6 differs from the hybrid coupler 116 of FIG. 4 in that it additionally includes phase delay elements incorporated into the second LC network 126. In this embodiment, both the second and third LC networks 126, 128 include phase delay elements (i.e., capacitors and inductors). For example, as shown in FIG. 6, the second LC network 126 includes an additional capacitor 170 and an additional inductor 172.

According to an embodiment, the phase delay elements 170, 172 of the second LC network 126 have different impedance than the phase delay elements 164, 166 of the third LC network 128. This asymmetry maintains an impedance difference between the second and third LC networks, and consequently provides a desired phase shift (e.g., 90 degrees, 180 degrees, etc.) as between the output ports 120, 122.

Figure 7:
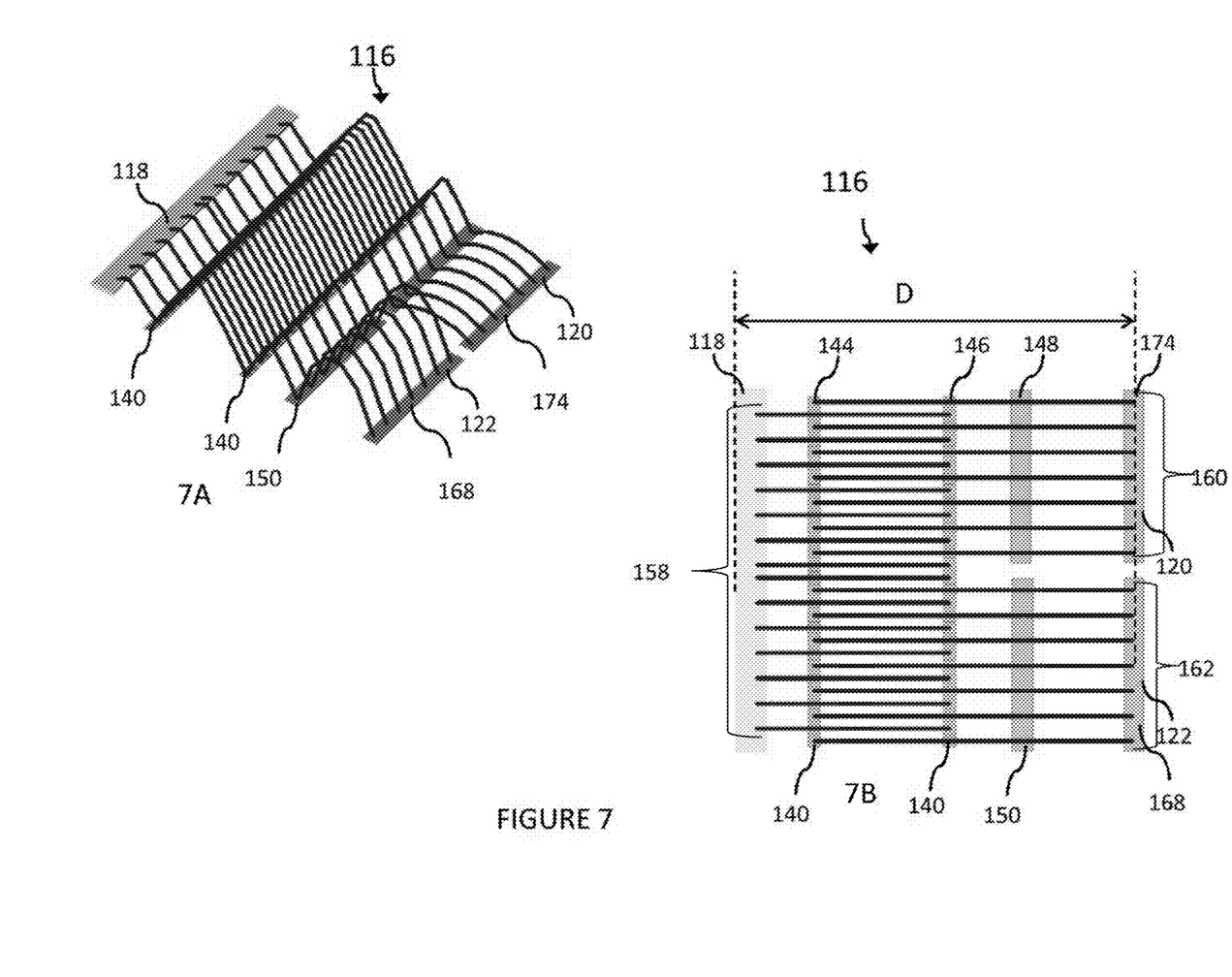

Referring to FIG. 7, an exemplary hybrid coupler 116 circuit that is formed by an arrangement of wire-bonds, chip capacitors and resistors is shown. This arrangement can be used to provide the circuit topology shown in FIG. 6, for example. The arrangement of FIG. 7 differs from the arrangement of FIG. 5 in that it additionally includes a fourth chip capacitor 174. The fourth chip capacitor 174 is used to provide the additional capacitor 170 of the second LC network 126 described above. The additional inductor 172 of the second LC network 126 described above is provided by spans of the second set 160 of bond wires 156 connecting the first chip capacitor 148 to the fourth chip capacitor 174. The impedance of the additional capacitor and inductor 170, 172 of the second LC network 126 can be adjusted in a similar manner as previously described. As shown in FIG. 7, the spans of the second set 160 of bond wires 156 connecting the first chip capacitor 148 to the fourth chip capacitor 174 have a different height than the spans of the third set 162 of bond wires 156 connecting the second chip capacitor 150 to the third chip capacitor 168 (i.e., the adjacent spans of bond wires 156 in the third LC network 128). This leads to a different inductance of the phase delay elements in the second LC network 126 than in the third LC network 128.

One notable advantage of the hybrid coupler 116 circuit configuration of FIG. 7 in contrast to the configuration of FIG. 5 is that the provision of the fourth chip capacitor 174 and the corresponding spans of bond wires 156 provides a uniform distance [D] between the first input port 118 and the first and second output ports 120, 122 of the hybrid coupler 116. By contrast, in the configuration of FIG. 5, the first and second output ports 120, 122 are offset from one another. Additionally, the incorporation of the fourth chip capacitor 174 and corresponding bond wires 156 into the hybrid coupler 116 provides additional flexibility with regard to the potential for impedance adjustment to the phase delay elements. Accordingly, a desired phase shift and/or impedance matching value can be achieved by impedance adjustment to any one of the additional capacitors 164, 170 or the additional inductors 166, 172.

Figure 8:
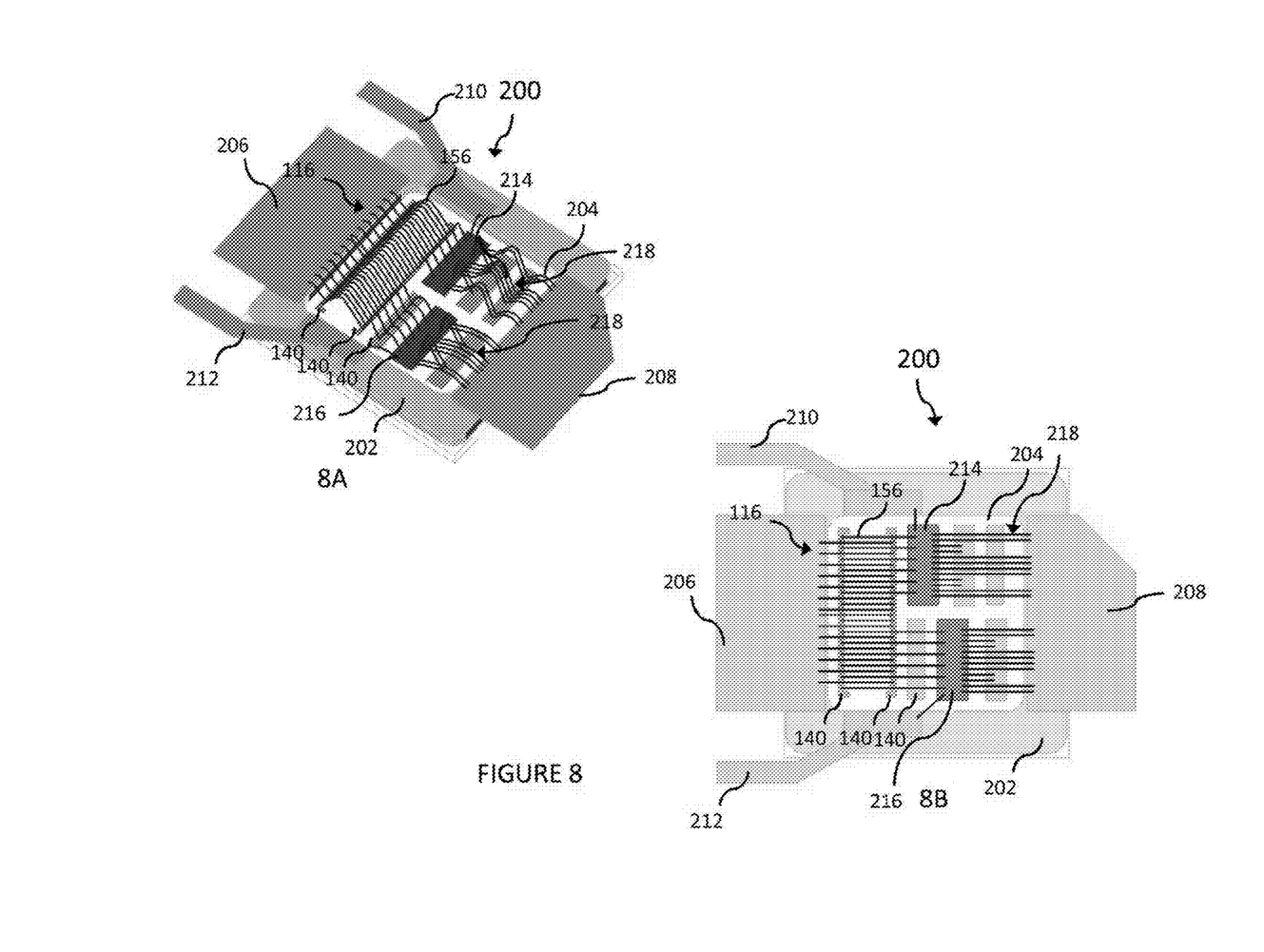

Referring to FIG. 8, a packaged RF amplifier circuit 200 is depicted. The RF amplifier circuit 200 may be (but is not necessarily) a Doherty amplifier circuit. The device package includes an electrically insulating substrate 202 with an electrically conductive chip mounting surface 204 formed on the substrate 202. The chip mounting surface 204 may be a copper layer, for example. The packaged RF amplifier circuit 200 further includes first and second electrically conductive leads 206, 208 that are adjacent to and extend away from the chip mounting surface 204. The first and second electrically leads 206, 208 may form the RF input terminal and the RF output terminal of the packaged RF amplifier circuit 200, respectively. The device package further includes first and second electrically conductive DC gate bias leads 210, 212 adjacent to and extending away from the chip mounting surface 204.

The packaged RF amplifier circuit 200 further includes first and second amplifiers 214, 216 that are mounted on the chip mounting surface. The first and second amplifiers 214, 216 may be semiconductor devices such as MOSFETs. According to an embodiment, the first and second amplifiers 214, 216 are mounted in a so-called source down configuration with one of the output terminals (e.g., source terminals) directly facing and electrically connected to the chip mounting surface 204. The input terminals of the first and second amplifiers 214, 216 (e.g., gate terminals) face upward such that they are accessible to bonding wires.

The hybrid coupler 116 as described herein is integrally formed as part of the packaged RF amplifier circuit 200. Integrally formed refers to the fact that the hybrid coupler 116 is provided by components that are internal to the device package. That is, each component of the hybrid coupler 116 is connected between the first and second electrically conductive leads 206, 208. In the embodiment of FIG. 8, the hybrid coupler 116 is connected between the first input lead 206 and the input terminals of the first and second amplifiers 214, 216. In this configuration, the hybrid coupler 116 therefore forms part of the input network that feeds the first and second amplifiers 214, 216.

According to an embodiment, the packaged RF amplifier circuit 200 includes an output match network 218 connected between the outputs of the first and second amplifiers 214, 216 and the second output terminal 208. The output match network 218 is configured to combine the power generated by the first and second amplifiers 214 and may also be configured to match the output impedance of the packaged RF amplifier circuit 200 to an intermediate fixed value (e.g., 5 ohms). The output match network 218 is formed from an arrangement of wire bonds and discrete chip capacitors in a similar fashion as the hybrid coupler 116. In this way, a packaged RF amplifier circuit 200 that is matched to a fixed impedance value and has a built-in hybrid coupler as part of the input match network is realized at minimal size and expense.

The term "directly electrically connected" describes a permanent low-ohmic connection between electrically connected elements, for example a direct contact between the concerned elements or a low-ohmic connection via a metal and/or highly doped semiconductor.

The term "electrically coupled" indicates that one or more intervening element(s) adapted for signal transmission may be provided between the electrically coupled elements, for example two electrically coupled elements may have transformers and/or transistors between them. In this case, the elements are electrically coupled, but not directly electrically connected.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An RF device package, comprising:
    an RF input terminal;
    first and second amplifier input nodes; and
    a hybrid coupler integrally formed as part of the RF device package and connected between the RF input terminal and the first and second amplifier input nodes, the hybrid coupler comprising:
        a first LC network directly electrically connected to the RF input terminal and physically disconnected from the first and second amplifier input nodes;
        a second LC network directly electrically connected to the first amplifier input node and physically disconnected from the RF input terminal and the second amplifier input node; and
        a third LC network directly electrically connected to the second amplifier input node and physically disconnected from the RF input terminal and the first amplifier input node,
        wherein the second and third LC networks are each inductively coupled to the first LC network in a transformer configuration.

2. The RF device package of claim 1, wherein the hybrid coupler is formed by an arrangement of wire-bonds, chip capacitors and resistors.

3. The RF device package of claim 2, wherein the hybrid coupler further comprises:
    a plurality of segmented capacitor arrays, each segmented capacitor array comprising a plurality of discrete capacitors; and
    a plurality of interdigitated inductive bond wires,
    wherein lower terminals of the discrete capacitors directly face a substrate of the RF device package, and
    wherein upper terminals of the discrete capacitors that are opposite the substrate are directly connected to the bond wires.

4. The RF device package of claim 3, wherein the first LC network comprises a first set of the inductive bond wires, wherein the second LC network comprises a second set of the inductive bond wires, wherein the third LC network comprises a third set of the inductive bond wires, wherein the first set of bond wires is interdigitated with the second set so as to form a first transformer between the first LC network and the second LC network, and wherein the first set of bond wires is interdigitated with the third set so as to form a second transformer between the first LC network and the third LC network.

5. The RF device package of claim 4, further comprising:
    an electrically conductive chip mounting surface formed on the substrate of the RF device package;
    an electrically conductive RF input lead adjacent to and extending away from the chip mounting surface, the RF input lead forming the RF input terminal;
    first and second electrically conductive DC gate bias leads adjacent to and extending away from the chip mounting surface; and
    first and second segmented capacitor arrays and first and second chip capacitors mounted on the chip mounting surface such that the lower terminals of the discrete capacitors directly face the chip mounting surface.

6. The RF device package of claim 5, wherein the first set of bond wires is directly electrically connected to the RF input lead and to the first and second segmented capacitor arrays, wherein the second set of bond wires is directly electrically connected to the first and second segmented capacitor arrays and first chip capacitor, and wherein the third set of bond wires is directly electrically connected to the first and second segmented capacitor arrays and second chip capacitor.

7. The RF device package of claim 5, wherein the first LC network comprises:
    first and second branches that are electrically parallel to one another; and
    a first resistor connected in series between the first and second branches,
    wherein the first branch is inductively coupled to the second LC network, and
    wherein the second branch is inductively coupled to the third LC network.

8. The RF device package of claim 7, wherein first resistor is formed by a span of material connecting two of the capacitors in the first segmented capacitor array.

9. The RF device package of claim 5, wherein the third LC network comprises delay elements configured to phase shift an RF signal that is applied to the RF input terminal and propagates across the first and second transformers such that the RF signal at the first amplifier input node is out of phase with the RF signal at the second amplifier input node.

10. The RF device package of claim 9, wherein the delay elements of the third LC network are configured to shift the RF signal at the second amplifier input node ninety degrees relative to the RF signal at the first amplifier input node.

11. The RF device package of claim 9, wherein the delay elements of the third LC network comprise a third chip capacitor mounted on the chip mounting surface, and a span of the third set of bond wires connected between the second chip capacitor and the third chip capacitor.

12. The RF device package of claim 9, wherein the second LC network comprises delay elements having different impedance as the delay elements of the third LC network.

13. The RF device package of claim 2, wherein the hybrid coupler is configured to equally divide RF power applied to the RF input terminal as between the first and second amplifier input nodes.

14. A packaged RF amplifier circuit, comprising:
a first input terminal;
a first output terminal;
first and second amplifiers each having an input coupled to the first input terminal and an output coupled to the first output terminal;
a hybrid coupler integrally formed as part of the packaged RF amplifier circuit and connected between the first input terminal and the inputs of the first and second amplifiers, the hybrid coupler comprising:
   a first LC network directly electrically connected to the first input terminal and physically disconnected from the inputs of the first and second amplifiers;
   a second LC network directly electrically connected to the input of the first amplifier and physically disconnected from the first input terminal and the input of the second amplifier; and
   a third LC network directly electrically connected to the input of the second amplifier and physically disconnected from the first input terminal and the input of the first amplifier,
wherein the second and third LC networks are each inductively coupled to the first LC network in a transformer configuration.

15. The packaged RF amplifier circuit of claim 14, wherein the first and second amplifiers are main and peaking amplifiers of a Doherty amplifier, and wherein the hybrid coupler is configured to divide RF power applied to the first input terminal equally between the inputs of the main and peaking amplifiers.

16. The packaged RF amplifier circuit of claim 15, wherein the hybrid coupler is formed by an arrangement of wire-bonds, chip capacitors and resistors.

17. The packaged RF amplifier circuit of claim 16, wherein the hybrid coupler is formed from a plurality of segmented capacitor arrays, each array comprising a plurality of discrete capacitors, and a plurality of interdigitated inductive bond wires connected to the segmented capacitor arrays.

18. The packaged RF amplifier circuit of claim 17, wherein the first LC network comprises a first set of the inductive bond wires, wherein the second LC network comprises a second set of the inductive bond wires, wherein the third LC network comprises a third set of the inductive bond wires, wherein the first set of bond wires is interdigitated with the second set so as to form a first transformer between the first LC network and the second LC network, and wherein the first set of bond wires is interdigitated with the third set so as to form a second transformer between the first LC network and the third LC network.

19. The packaged RF amplifier circuit of claim 15, further comprising an output match network connected between the outputs of the main and peaking amplifiers and the first output terminal.

20. The packaged RF amplifier circuit of claim 19, wherein the output match network is formed from an arrangement of chip capacitors and inductive bond wires.

* * * * *

UNITED STATES PATENT AND TRADEMARK OFFICE
CERTIFICATE OF CORRECTION

PATENT NO. : 9,628,032 B1
APPLICATION NO. : 14/966474
DATED : April 18, 2017
INVENTOR(S) : Marbell et al.

Page 1 of 1

It is certified that error appears in the above-identified patent and that said Letters Patent is hereby corrected as shown below:

In the Claims

Column 12, Line 53 (Claim 8), please change "wherein first" to -- wherein the first --.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*